(12) United States Patent
Chi

(10) Patent No.: US 9,171,586 B2
(45) Date of Patent: Oct. 27, 2015

(54) DUAL MEMORY BITCELL WITH SHARED VIRTUAL GROUND

(71) Applicant: Oracle International Corporation, Redwood City, CA (US)

(72) Inventor: Jeff Wenzen Chi, Sunnyvale, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 14/181,363

(22) Filed: Feb. 14, 2014

(65) Prior Publication Data

US 2015/0235674 A1   Aug. 20, 2015

(51) Int. Cl.
*G11C 15/04* (2006.01)
*G11C 5/06* (2006.01)
*G11C 5/12* (2006.01)

(52) U.S. Cl.
CPC .. *G11C 5/06* (2013.01); *G11C 5/12* (2013.01); *G11C 15/04* (2013.01)

(58) Field of Classification Search
CPC ................................. G11C 15/04; G11C 11/16
USPC ................................................. 365/49.1, 158
See application file for complete search history.

(56) References Cited

U.S. PATENT DOCUMENTS

| | | | |
|---|---|---|---|
| 5,789,776 A * | 8/1998 | Lancaster et al. | 257/296 |
| 6,459,611 B2 | 10/2002 | Rimondi | |
| 6,594,195 B2 | 7/2003 | Chen | |
| 6,643,173 B2 * | 11/2003 | Takemura | 365/185.05 |
| 6,707,721 B2 | 3/2004 | Singh et al. | |
| 6,861,714 B2 * | 3/2005 | Lee et al. | 257/390 |
| 6,873,007 B2 * | 3/2005 | Sugita et al. | 257/321 |
| 7,031,179 B2 | 4/2006 | Yon et al. | |
| 7,480,166 B2 | 1/2009 | Jeung et al. | |
| 8,294,212 B2 | 10/2012 | Wang et al. | |
| 8,422,262 B2 | 4/2013 | Nevers et al. | |
| 2012/0147642 A1 | 6/2012 | Gronlund et al. | |

OTHER PUBLICATIONS

Dao-Ping Wang and Wei Hwang, A 45 nm 10T Dual-Port SRAM with Shared Bit-Line Scheme for Low Power Operation, American Scientific Publishers, 13 pages.

Dao-Ping Wang, Hon-Jarn Lin, and Wei Hwanga Two-Write and Two-Read Multi-Port SRAM with Shared Write Bit-Line Scheme and Selective Read Path for Low Power Operation, Journal of Low Power Electronics, vol. 9, 1 page.

* cited by examiner

*Primary Examiner* — Michael Tran
(74) *Attorney, Agent, or Firm* — Marsh Fischmann & Breyfogle LLP; Daniel J. Sherwinter

(57) ABSTRACT

Embodiments include systems and methods for using a shared virtual ground to implement a dual memory bitcell. Some embodiments of the dual memory bitcell described herein operate substantially as would two adjacent conventional bitcells, but with reduced power, reduced area, and other features. For example, each of two memory bitcells can be coupled with a write bitline, a virtual ground line, and a respective write wordline. The virtual ground is configured to be switched according to the write bitline. In such a configuration, the value stored by the memory bitcells can be a function of the write bitline and the virtual ground line (e.g., when the respective write word line of the memory bitcell is asserted). Certain embodiments can include a novel physical layout of the dual memory bitcell. Some implementations of the novel physical layout can include changes to the physical memory bitcell components and to one or more metal layers.

19 Claims, 10 Drawing Sheets

DUAL MEMORY BITCELL WITH SHARED VIRTUAL GROUND

FIELD

Embodiments relate generally to memory circuits, and, more particularly, to memory bitcell circuits and physical layouts thereof.

BACKGROUND

Typical memory circuits, such as static random access memory (SRAM) circuits, include a number of bitcells that can be written to and read from. Conventional bitcell designs in modern nano process technology often use a dual bitline scheme to help ensure writability. Such a scheme can have various limitations. One such limitation is that, as the channel length gets smaller (e.g., as circuit dimensions decrease with newer manufacturing processes), bitcells are becoming more track/signal limited than transistor limited, which can result in many dummy transistors being added to accommodate the bitcell area dictated by wiring tracks. Another such limitation is that conventional bitcell designs typically seek a balanced structure of true/false nodes, which can not only limits the flexibility of choosing transistor characteristics (e.g., types, size, and usage to fit various design specifications), but can also limit design alternatives. Still another such limitation is that, even when bitcell layouts are packed as tightly as possible, many dummy transistors are often added to fulfill LPE (Layout Proximity Effect), which is typically a waste of area.

BRIEF SUMMARY

Among other things, systems and methods are described for using a shared virtual ground to implement a dual memory bitcell. Some embodiments of the dual memory bitcell described herein operate substantially as would two adjacent conventional bitcells, but with reduced power, reduced area, and other features. For example, each of two memory bitcells can be coupled with a write bitline, a virtual ground line, and a respective write wordline. The virtual ground is configured to be switched according to the write bitline. In such a configuration, the value stored by the memory bitcells can be a function of the write bitline and the virtual ground line (e.g., when the respective write word line of the memory bitcell is asserted). Certain embodiments can include a novel physical layout of the dual memory bitcell. Some implementations of the novel physical layout can include changes to the physical memory bitcell components and to one or more metal layers.

According to one set of embodiments, a memory circuit is provided. The circuit includes: a first memory bitcell coupled with a write bitline, a first write wordline, and a virtual ground line, so that a value stored by the first memory bitcell when the first write wordline is asserted is a function of the write bitline and the virtual ground line; a second memory bitcell coupled with the write bitline, a second write wordline, and the virtual ground line, so that a value stored by the second memory bitcell when the second write wordline is asserted is a function of the write bitline and the virtual ground line; and a virtual ground switch that operates to switch the virtual ground line as a function of the write bitline.

According to another set of embodiments, a memory system is provided. The system includes: a first memory bitcell coupled with a first write wordline polygate and comprising a first memory core coupled between a first write port and a second write port, the first write port coupled with a write bitline, and the second write port selectively coupled with a virtual ground; and a second memory bitcell coupled with a second write wordline polygate and comprising a second memory core coupled between a third write port and the second write port, the third write port coupled with the write bitline.

According to another set of embodiments, a method is provided. The method includes: coupling a first memory bitcell with a write bitline, a first write wordline, and a virtual ground line, so that a value stored by the first memory bitcell when the first write wordline is asserted is a function of the write bitline and the virtual ground line; and coupling a second memory bitcell with the write bitline, a second write wordline, and the virtual ground line, so that a value stored by the second memory bitcell when the second write wordline is asserted is a function of the write bitline and the virtual ground line, wherein the virtual ground line is selectively coupled with a virtual ground as a function of the write bitline.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
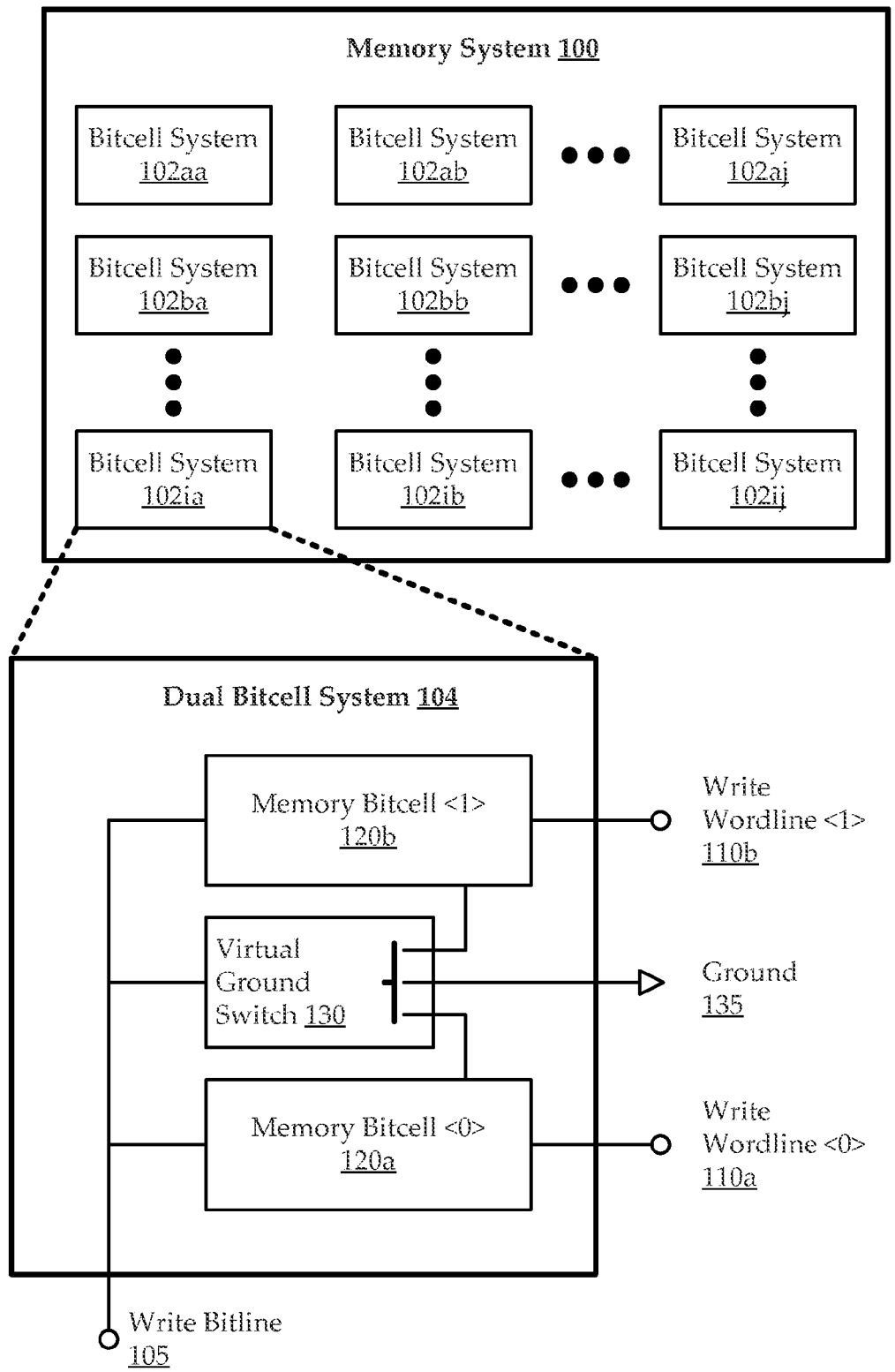
FIG. 1 shows a simplified block diagram of a memory system and an illustrative dual bitcell system, according to various embodiments.

FIG. 1 shows a simplified block diagram of a memory system 100 and an illustrative dual bitcell system 104, according to various embodiments. Some implementations of the memory system 100 can include semiconductor memory that uses bi-stable latching (e.g., cross-coupled inverters or the like) to store bits in bitcells, such as static random access memory (SRAM). The memory system includes a number of bitcell systems 102, which can be arranged as an array or in any other suitable manner. According to embodiments described herein, at least some of the bitcell systems 102 of the memory system 100 are implemented as novel "dual" bitcell systems 104.

The illustrated dual bitcell system 104 includes two memory bitcells 120 that share a ground 135. A first memory bitcell 120a (also labeled as "Memory Bitcell <0>") is coupled with (i.e., in direct or indirect electrical communication with) a write bitline 105, a first write wordline 110a, and a virtual ground switch 130. A second memory bitcell 120b (also labeled as "Memory Bitcell <1>") is coupled with the write bitline 105, a second write wordline 110b, and the virtual ground switch 130. The virtual ground switch 130 operates to selectively couple the memory bitcells 120 (e.g., one side of the memory bitcells 120) with a ground 135 (referred to herein as "activating the virtual ground") as a function of the write bitline 105. For example, the ground 135 can be activated when the write bitline 105 is HIGH, and not otherwise. According to embodiments of the dual bitcell system 104, a value stored by either memory bitcell 120 is a function of the present value on the write bitline 105 and the present state of the virtual ground switch 130 when its respective write wordline 110 is asserted. In one illustrative implementation, applying a logic HIGH to the write bitline 105 causes the virtual ground switch 130 to activate the ground 135. This, in turn, can cause one side (e.g., a "TRUE" side) of the memory bitcells 120 to be HIGH, and the other side of the memory bitcells 120 (e.g., a "FALSE" side) of the memory bitcells 120 to be LOW. The value can be stored by either of the memory bitcells 120 by activating one of the write wordlines 110.

Figure 2:
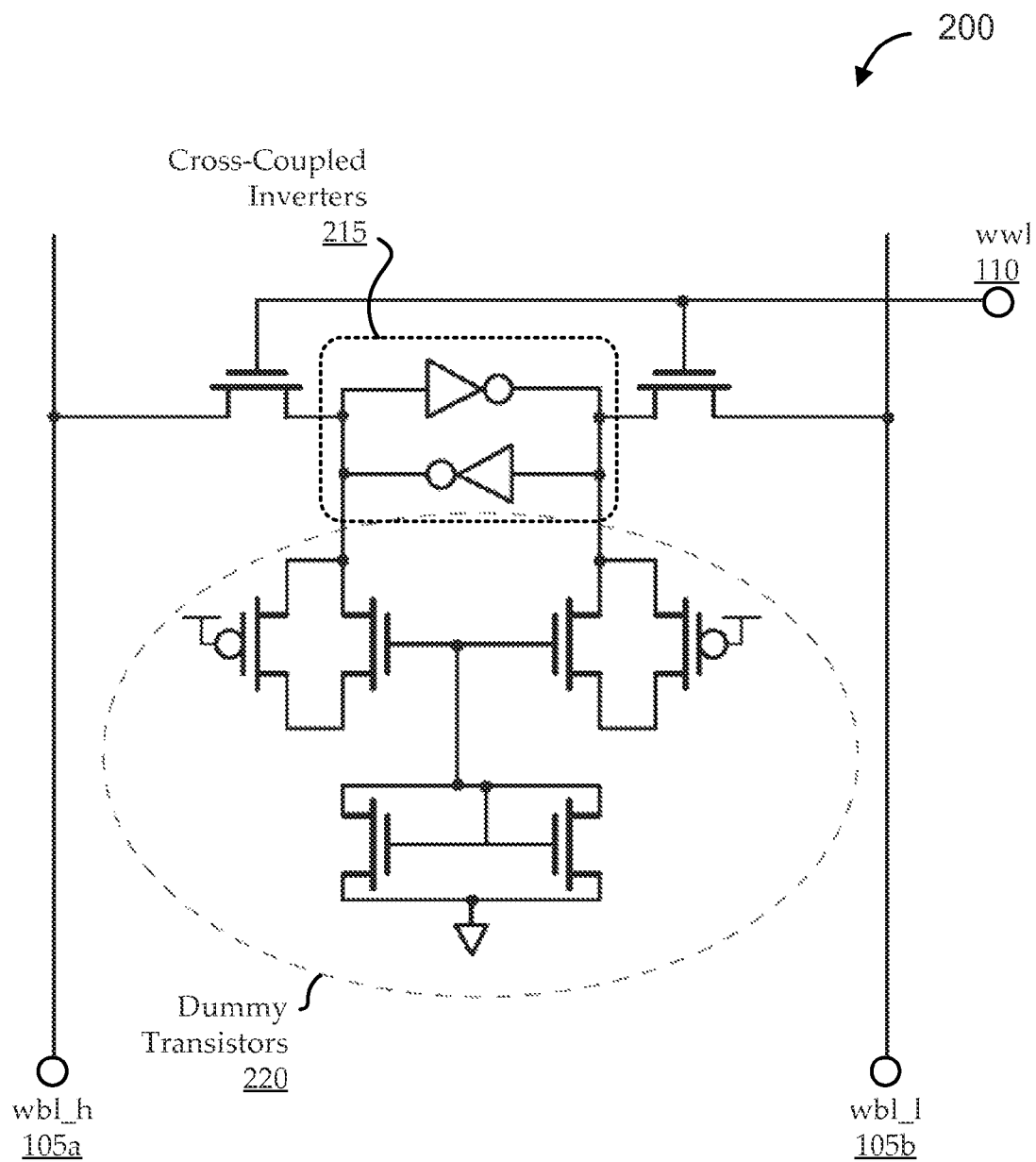
FIG. 2 shows a write portion of an illustrative, conventional memory bitcell circuit.

For the sake of added clarity and context, it is helpful to describe a conventional memory bitcell configuration. FIG. 2 shows a write portion of an illustrative, conventional memory bitcell circuit 200. The conventional memory bitcell circuit 200 includes a pair of cross-coupled inverters 215 coupled between two transistors (e.g., n-type metal-oxide semiconductor (NMOS) transistors). The two transistors are coupled between two write bitlines 105 (i.e., a high write bitline (wbl_h) 105a and a low write bitline (wbl_l) 105b). The gates of the two transistors are coupled with a write wordline (wwl) 110. The two transistors, and the cross-coupled inverters 215 (which are typically implemented as a set of four transistors) are sometimes referred to as a six-transistor core. As will be described below, the conventional memory bitcell circuit 200 typically includes a number of additional "dummy" transistors 220 (e.g., six) that do not function as part of the memory circuitry, but are used to help reduce degradation of transistors at the edges of oxide diffusion columns in the physical layout. In operation, a value can be written to the bitcell by applying the desired value to wbl_h 105a, applying the complement of the desired value to wbl_l 105b, and asserting wwl 110. For example, if a HIGH is applied to wbl_h 105a, and a LOW is applied to wbl_l 105b, asserting wwl 110 causes HIGH and LOW values to be transferred (across the transistors) to respective sides of the cross-coupled inverters 215, which can effectively store that state when wwl 110 is de-asserted.

Figure 3A:
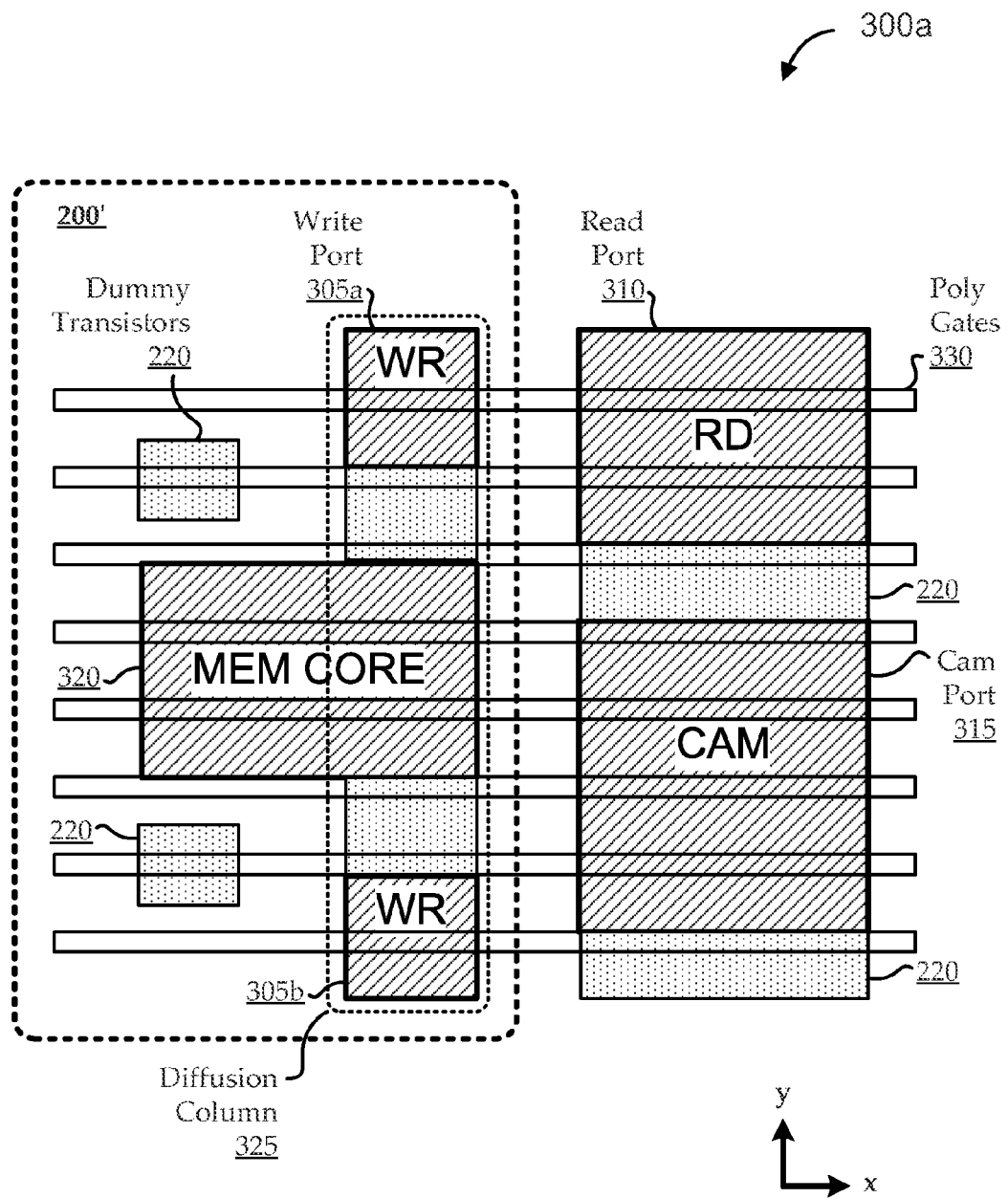
FIGS. 3A and 3B show illustrative physical layouts of conventional memory bitcells.
Figure 3B:
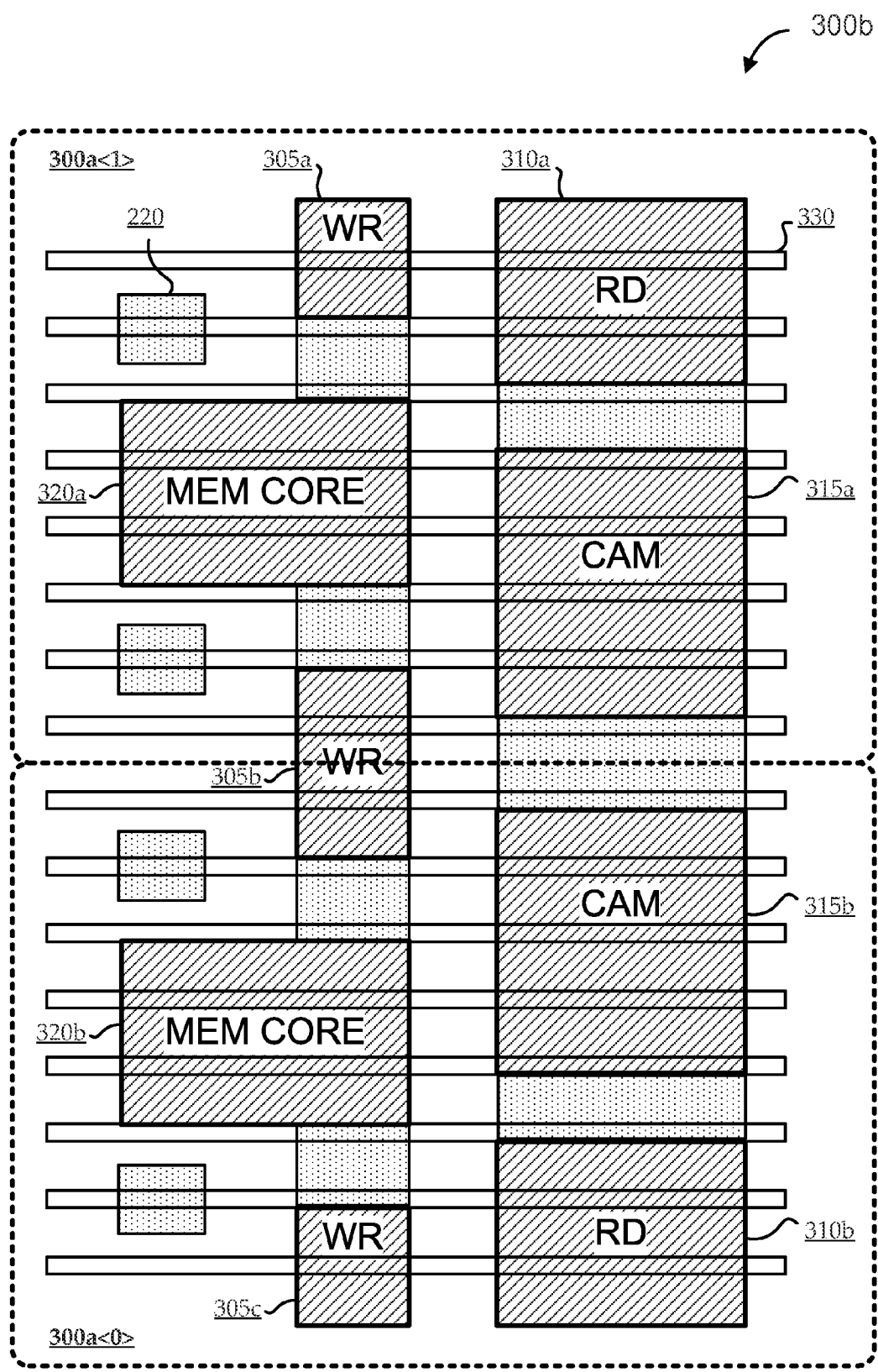

FIGS. 3A and 3B show illustrative physical layouts of conventional memory bitcells. Turning first to FIG. 3A, a single memory bitcell layout 300a is shown, including a memory core 320, two write ports 305, a read port 310, and a CAM port 315. The illustrated implementation is a typical "eight poly pitch" layout, indicating that the bitcell layout covers eight polygates 330 in the pitch ("y") direction. While each polygate 330 is shown as a single rectangle, such a depiction is only intended to illustrate spacing and not functionality. For example, some or all of the polygates can be discontinuous and can perform different functions in different diffusion columns. As illustrated, the memory core 320 and write ports 305 can be an implementation of the conventional memory bitcell circuit 200 described with reference to FIG. 2. For example, the memory core 320 can be implemented as a six-transistor layout with cross-coupled inverters for bi-stable latching, and the write ports 305 can be coupled with write bitlines 105. The read port 310 can be used to read out memory values from the bitcell. The CAM port 315 can be used to compare the memory contents with a "key" value, for example, to check for integrity (e.g., in some implementations, the CAM port can return a "hit" or "miss" value").

Notably, the illustrated layout includes multiple dummy transistors 220 (e.g., the polygates 330 in the designated regions of the designated OD columns can implement the dummy transistors). The physical implementation of a semiconductor circuit can typically involve deposition of various chemicals on a wafer substrate (e.g., a silicon wafer). For example, physical implementation of metal-oxide semiconductor (MOS) transistors can involve deposition of silicon dioxide (typically referred to simply as "oxide" in such a process), which can result in diffusion of impurities from the oxide into adjacent layers of the substrate, thereby doping the layers with the impurities. Such oxide diffusion is often implemented in colums, thereby forming so-called oxide diffusion (OD) columns. Transistors near the edges of the OD columns tend to manifest increased decredation over those closer to the inside of the OD columns. Accordingly, dummy transistors 220 are typically added to the physical layout to help form continuous OD columns and to limit or prevent operating transistors (i.e., those that function as part of the memory circuitry) from being on the outside of the OD column. For example, as illustrated, dummy transistors 220 are placed on either side of the memory core 320. As shown in FIG. 2, such a configuration typically involves six dummy transistors 220 as part of the write portion of the layout (e.g., inside the dashed box labeled 200'). The dummy transistors 220 can effectively add capacitance to the layout, which can increase power consumption.

FIG. 3B shows an illustrative, conventional, two-bitcell layout 300b. The layout 300b is effectively an implementation of two, adjacent memory bitcell layouts 300a of FIG. 3A. As illustrated, the two-bitcell layout takes up sixteen polygates of pitch and uses a large number of dummy transistors 220. As described herein, embodiments include systems and methods for using a shared virtual ground to implement a dual memory bitcell. Some implementations perform substantially the same functionality as two adjacent, conventional bitcells (e.g., as illustrated in FIG. 3B), but with reduced power, reduced area, and other features.

Figure 4:
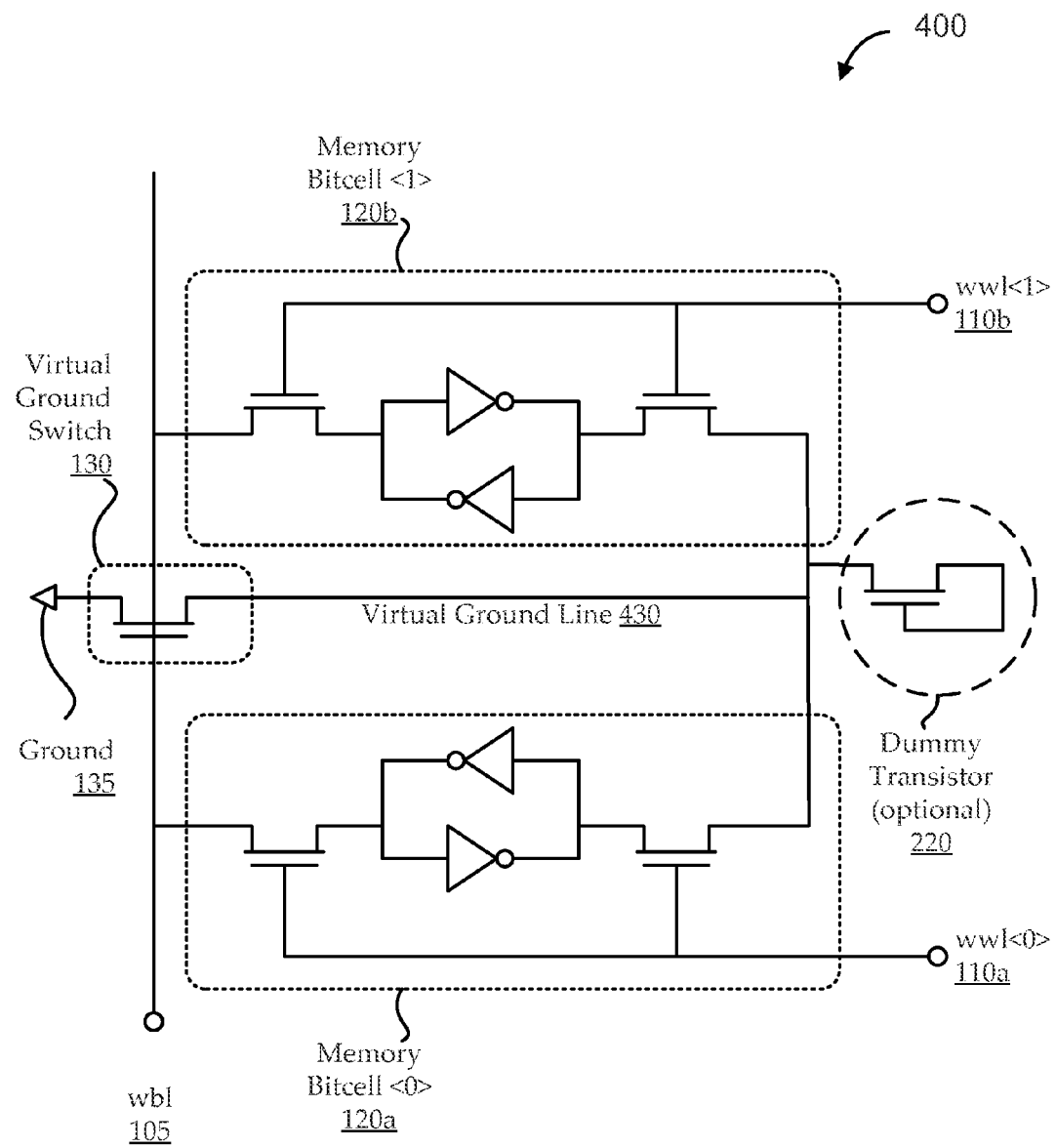
FIG. 4 shows a write portion of an illustrative dual memory bitcell circuit, according to various embodiments.

FIG. 4 shows a write portion of an illustrative dual memory bitcell circuit 400, according to various embodiments. The dual memory bitcell circuit 400 includes two memory bitcells 120 that share a virtual ground line 430. A first memory bitcell 120a (labeled as "Memory Bitcell <0>") is coupled with a write bitline 105 (labeled "wbl"), a first write wordline 110a (labeled "wwl<0>"), and the virtual ground line 430. A second memory bitcell 120b (labeled as "Memory Bitcell <1>") is coupled with the write bitline 105, a second write wordline 110b (labeled "wwl<1>"), and the virtual ground line 430. A virtual ground switch 130 (e.g., an NMOS transistor) operates to selectively couple the virtual ground line 430 with the ground 135 as a function of the write bitline 105. For example, when a HIGH is applied to the write bitline 105, the virtual ground switch 130 couples the virtual ground line 430 to the ground 135, thereby "activating" the virtual ground. As illustrated, each memory bitcell circuit 120 includes a pair of cross-coupled inverters coupled between two transistors (referred to herein as "selector" transistors). In each memory bitcell circuit 120, one of the selector transistors is further coupled with the write bitline 105 and the other selector transistor is further coupled with the virtual ground line 430, and the gates of both selector transistors are coupled with the respective write wordline 110.

While the circuit is shown with certain numbers and types of components, those components are intended only to illustrate certain implementations of the underlying functionality. For example, more or fewer transistors can be used, other types of transistors can be used, etc. As will be described more fully below, use of the shared ground 135 can provide various features. One such feature is that the dual memory bitcell circuit 400 can be physically laid out with appreciably less area than can two conventional memory bitcells. For example, the dual memory bitcell circuit 400 can be implemented with a reduction in the number of dummy transistors 220 (e.g., from six in the conventional implementation of FIG. 2 to two in the novel implementation of FIG. 4). Another such feature is that a single write bitline 105 can be used, which can elimination a signal path and its associated shielding path.

For the sake of illustration, write operation of the circuit is described assuming that all transistors are NMOS-type transistors. Suppose it is desired to write a '1' (assumed to be logical HIGH in this illustration) to the first memory bitcell 120a. A HIGH can be applied to the write bitline 105, which can cause the side of both memory bitcells 120a coupled with the write bitline 105 (i.e., one side of one of the selector transistors of each memory bitcell 120) to be pulled HIGH and can cause the virtual ground switch 130 to pull the other side of both memory bitcells 120a (i.e., one side of the other of the selector transistors of each memory bitcell 120) LOW through the virtual ground line 430. Assuming neither write wordline 110 is asserted, these HIGH and LOW values are blocked from being applied to either set of cross-coupled inverters by the selector transistors of both memory bitcells 120. The first write wordline 110a can be asserted, which can turn on the two selector transistors of the first memory bitcell 120a, thereby applying the HIGH and LOW values to respective sides of the set of cross-coupled inverters in the first memory bitcell 120a. The first write wordline 110a can be subsequently de-asserted, which can turn off the two selector transistors of the first memory bitcell 120a, thereby effectively storing (e.g., latching) the HIGH and LOW values at the respective sides of the set of cross-coupled inverters in the first memory bitcell 120a. Now suppose it is desired to write a '0' (assumed to be logical LOW in this illustration) to the first memory bitcell 120a. A LOW can be applied to the write bitline 105, which can cause the side of both memory bitcells 120a coupled with the write bitline 105 to be pulled LOW and can cause the virtual ground switch 130 to deactivate the virtual ground. Deactivating the virtual ground can effectively cause the virtual ground line 430 (and the other side of both memory bitcells 120a coupled thereto) to float. When the first write wordline 110a is asserted, the two selector transistors of the first memory bitcell 120a can turn on, thereby applying the LOW value to the write bitline 105 side of the set of cross-coupled inverters in the first memory bitcell 120a. With the other side of the set of cross-coupled inverters effectively floating, the cross-coupled inverters develop a HIGH on the virtual ground line 430 side (in response to the HIGH on the write bitline 105 side). The first write wordline 110a can be subsequently de-asserted, which can turn off the two selector transistors of the first memory bitcell 120a, thereby effectively storing (e.g., latching) the LOW and HIGH values at the respective sides of the set of cross-coupled inverters in the first memory bitcell 120a. As in a conventional bitcell implementation, one side of the set of cross-coupled inverters is effectively a "TRUE" side that indicates the value intended to be stored, and the other side of the set of cross-coupled inverters is effectively a "FALSE" side that indicates the complement of the value intended to be stored.

Figure 5:
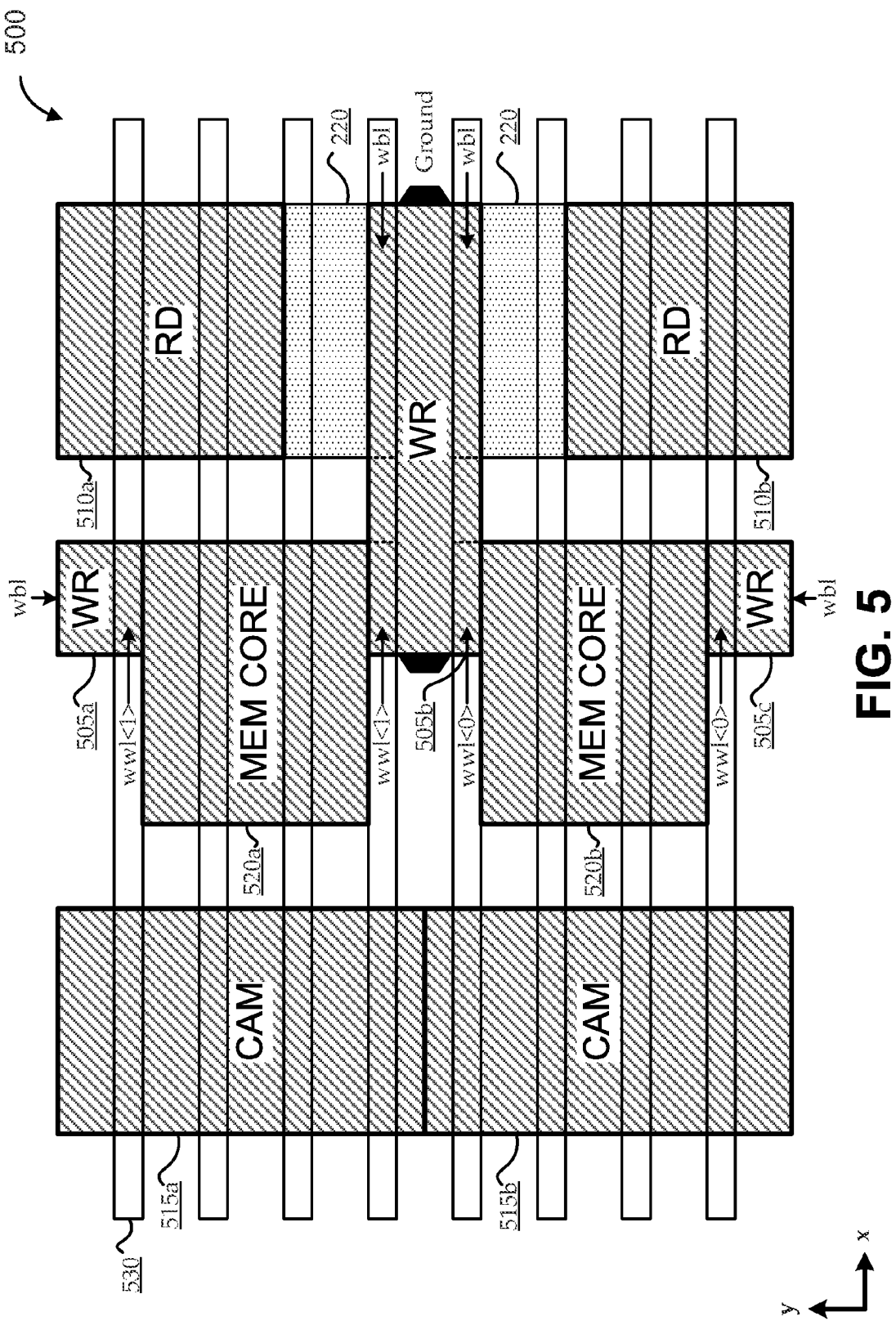
FIG. 5 shows an illustrative physical layout of a dual memory bitcell, according to various embodiments.

FIG. 5 shows an illustrative physical layout 500 of a dual memory bitcell, according to various embodiments. The dual memory bitcell layout 500 includes two memory cores 520, three write ports 505, two read ports 510, and two CAM ports 515. The memory cores 520 and write ports 505 can implement the dual memory bitcell circuit 400 of FIG. 4. For example, each memory core 520 can implement a six-transistor layout with bi-stable latching, the outer write ports 505a and 505c can be coupled with the write bitline, and the inner write port 505b can be coupled with virtual ground through a virtual ground switch. In the illustrated implementation, the polygates on either side of the first memory core facilitate the write wordline signaling for the first memory bitcell, and the polygates on either side of the second memory core facilitate the write wordline signaling for the second memory bitcell. The write bitline signaling can be coupled with the diffusion portions of write ports 505a and 505c. Write port 505b can be coupled with four polygates (e.g., two in the rightmost OD column and two in the central OD column of the layout). In the central OD column, write port 505b can be coupled with a polygate associated with each of the two write wordlines 110; in the rightmost OD column, write port 505b can be coupled with one polygate that can act as the virtual ground switch (e.g., by being driven by the write bitline signal and selectively activating the virtual ground accordingly) and with another poly gate that can act either as a dummy transistor, as a second leg for the virtual ground switch, or for another suitable use. As described above, the read ports 510 can be used to read out memory values from respective bitcells, and the CAM ports 515 can be used to compare the memory contents of respective bitcells with a key value. The CAM ports 515 can be placed adjacent to one another by exploiting a shared VSS (e.g., ground or other common voltage).

The shared virtual ground permits sharing of write port 505b, which allows the two memory cores 520 and three write ports 505 to be packed into a space of eight polygates of pitch. This further permits formation of a single, continuous, central OD column without adding dummy transistors. The resulting layout can be appreciably smaller in pitch and slightly larger in width (x), in comparison with a conventional two-bitcell layout. For example, one implementation is approximately fifty percent smaller in pitch (e.g., eight poly pitch compared to a conventional sixteen), and approximately forty percent larger in width (e.g., 1.68 nm compared to a conventional 1.2 nm), for a reduction of approximately thirty percent in overall area (i.e., 0.5y×1.4x=0.7xy). The reduction in overall area can allow more bitcells to be packed into the same semiconductor area (e.g., potentially reducing per-die cost). Further, as described above, a reduction in the number of dummy transistors can reduce capacitance and power consumption. Embodiments of the dual bitcell approach can also increase flexibility in selecting bitcell transistors and in adjusting block aspect ratio when encountering placement criticality in a cluster.

Figure 6A:
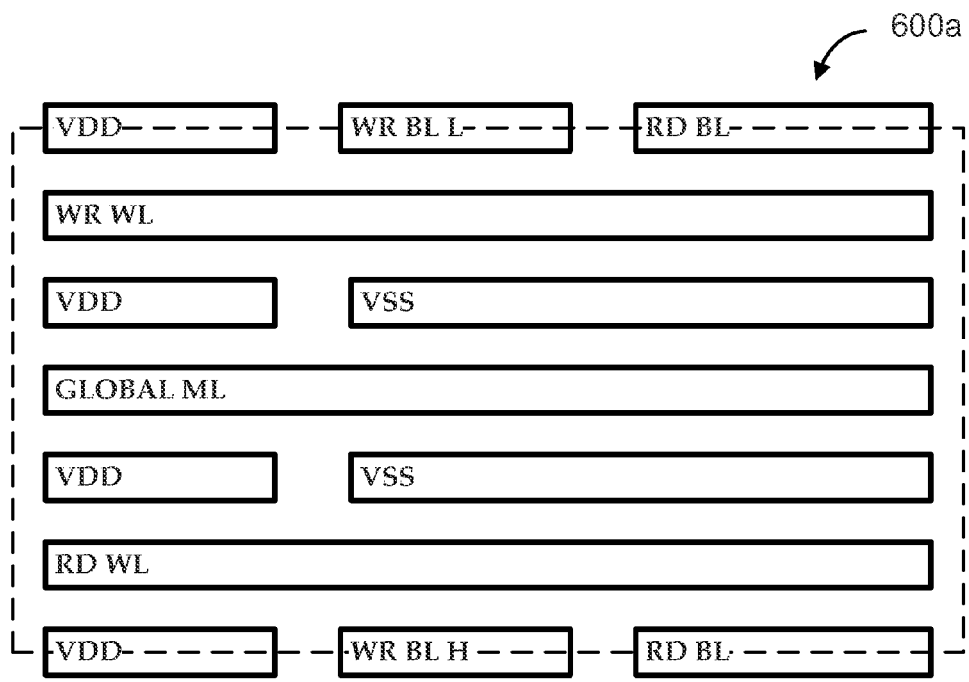
FIGS. 6A and 6B show illustrative layouts for two metal layers, respectively, according to some conventional implementations.
Figure 6B:
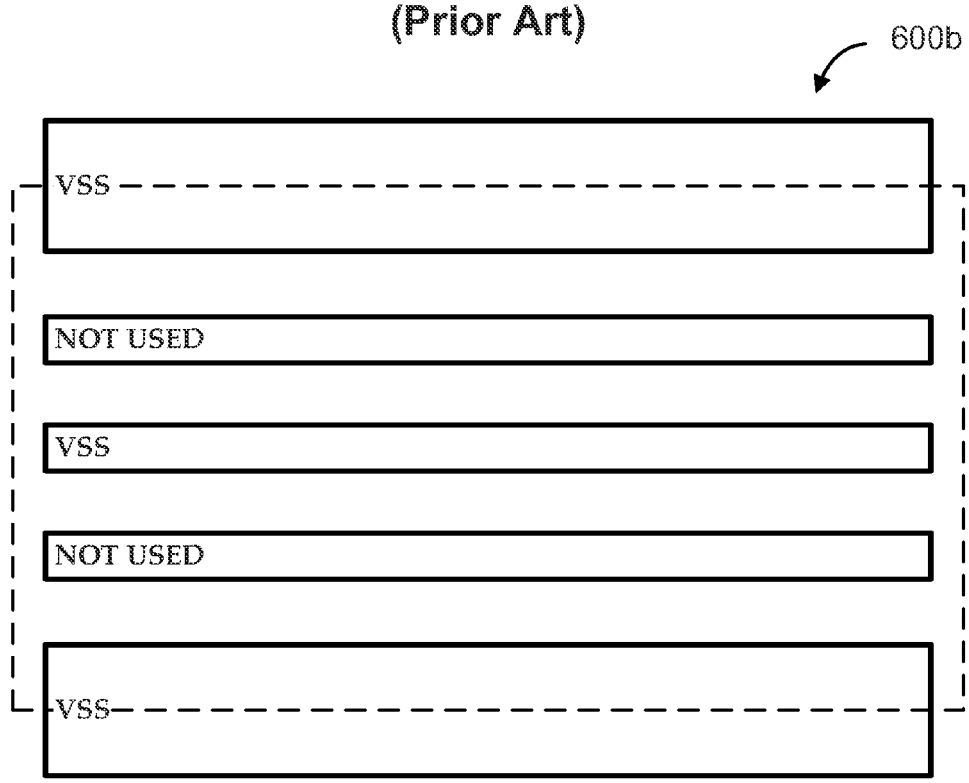

In support of embodiments of the novel dual memory bitcell layout, such as the one shown in FIG. 5, some implementations include changes to metal layers of the chip (e.g., substrate) on which the memory is fabricated. For the sake of context, FIGS. 6A and 6B show illustrative layouts for two metal layers (e.g., "metal four" and "metal six"), respectively, according to some conventional implementations. Turning first to FIG. 6A, a typical metal layer four layout 600a is shown with a number of horizontal trace regions. For example, the traces include a global matchline trace in a center trace region; write and read wordline traces in regions above and below the global matchline, respectively, each separated from the global matchline by non-signal traces (e.g., "VSS" and "VDD" can provide access to DC voltage levels and can provide inter-signal shielding); and read and write bitlines in the topmost and bottommost trace regions. Turning to FIG. 6B, a typical metal layer six layout 600b is shown with a number of horizontal trace regions, with some trace regions left unused. For example, the traces include a VSS trace in center and outer trace regions, separated by unused trace regions.

Figure 7A:
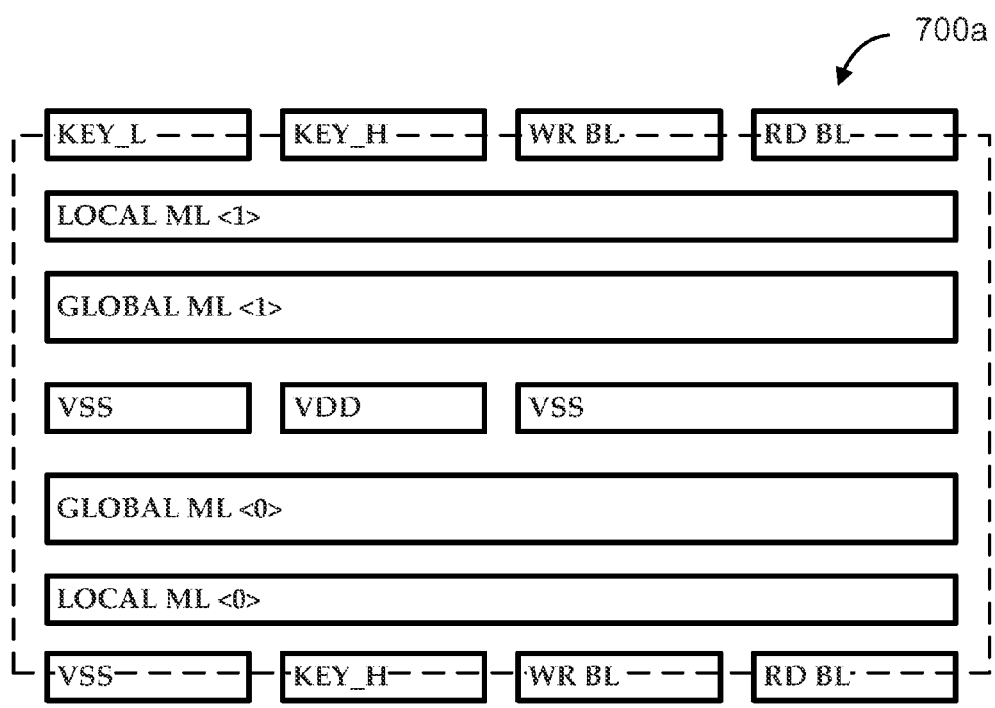
FIGS. 7A and 7B show illustrative layouts for two metal layers, respectively, according to some novel, dual memory bitcell implementations.
Figure 7B:
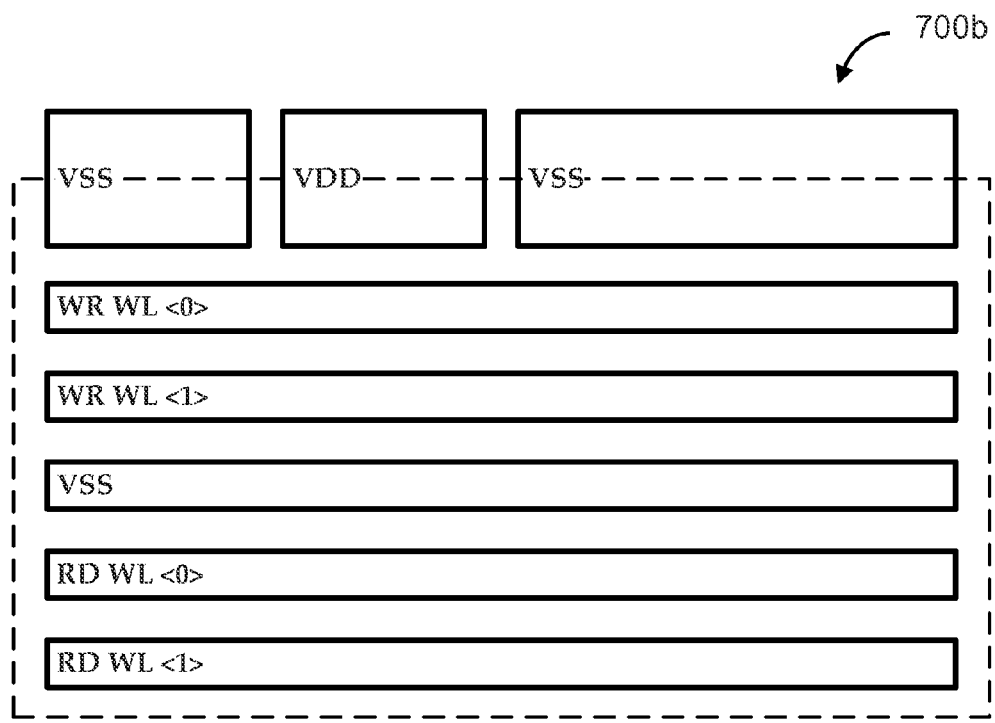

FIGS. 7A and 7B show illustrative layouts for two metal layers (e.g., "metal four" and "metal six"), respectively, according to some novel, dual memory bitcell implementations. Turning first to FIG. 7A, a novel metal layer four layout 700a is shown with different horizontal trace regions from those in FIG. 6A. For example, the traces include a non-signal center trace (e.g., "VSS" and "VDD" can be used provide access to DC voltage levels and to provide inter-signal shielding between the adjacent matchlines). On each side of the central trace is a global matchline trace and a local matchline trace corresponding to one of the memory bitcells. For example, global and local matchline traces for the first memory bitcell run below the central trace, and global and local matchline traces for the second memory bitcell run above the central trace. For example, global matchline and local matchline typically switch in the same direction, so that they can be placed side-by-side without inducing negative coupling issues. The topmost and bottommost trace regions can include traces for the write bitline, the read bitline, and key signals (used by the CAM ports, as described above). Turning to FIG. 7B, a novel metal layer six layout 700b is shown with different horizontal trace regions from those in FIG. 6B. For example, the traces include a VSS trace in center and topmost trace regions. Write wordlines for the two memory bitcells can be run adjacent to each other in trace regions above the central trace, and read wordlines for the two memory bitcells can be run adjacent to each other in trace regions below the central trace. It will be appreciated that the particular trace configuration shown in FIGS. 7A and 7B is intended to support the particular physical dual memory bitcell layout shown in FIG. 5, and it not intended to limit the scope of possible implementations. For example, various changes can be made to any or all of the dual memory bitcell circuit 400, the dual memory bitcell layout 500, the metal layer layouts 700, etc. without departing from the novel scope described herein.

Figure 8:
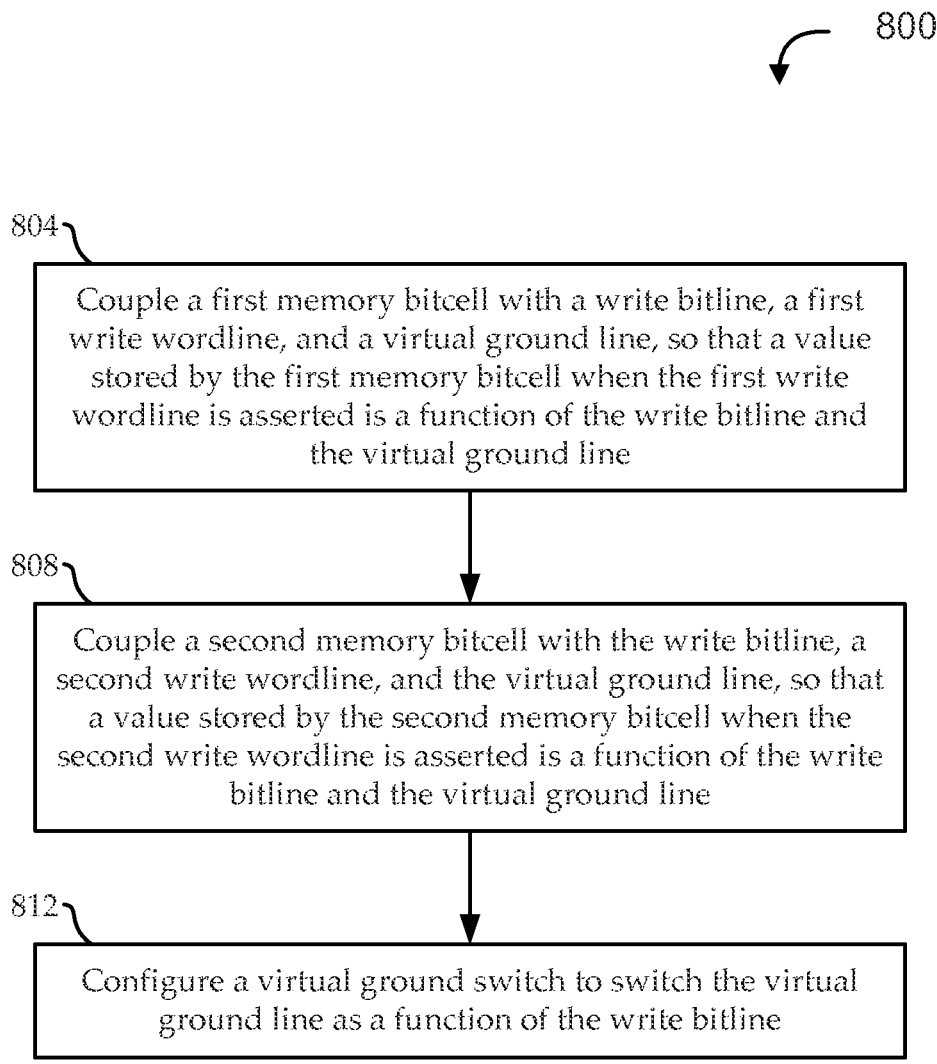
FIG. 8 shows a flow diagram of an illustrative method for providing a dual memory bitcell, according to various embodiments.

FIG. 8 shows a flow diagram of an illustrative method 800 for providing a dual memory bitcell, according to various embodiments. The method can be performed using any suitable systems or structures, including those described above in FIGS. 1, 4, 5, 7A and 7B. Embodiments of the method 800 begin at stage 804 by coupling a first memory bitcell with a write bitline, a first write wordline, and a virtual ground line, so that a value stored by the first memory bitcell when the first write wordline is asserted is a function of the write bitline and the virtual ground line. At stage 808, a second memory bitcell can be coupled with the write bitline, a second write wordline, and the virtual ground line, so that a value stored by the second memory bitcell when the second write wordline is asserted is a function of the write bitline and the virtual ground line. According to some embodiments, the virtual ground line is selectively coupled with a virtual ground as a function of the write bitline. For example, at stage 812, a virtual ground switch can be configured to switch the virtual ground line as a function of the write bitline.

Figures 9A, 9B:
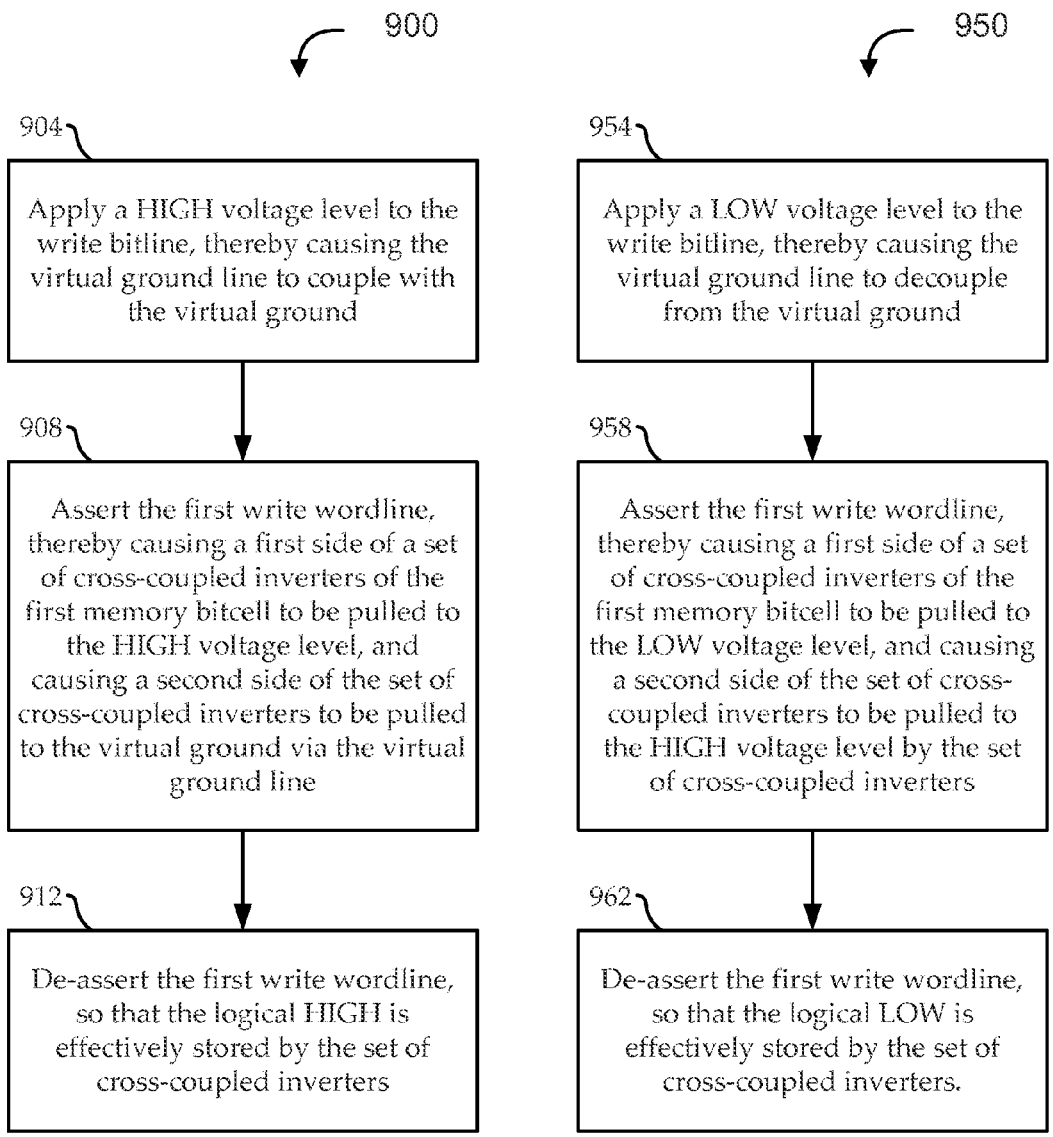
FIGS. 9A and 9B show flow diagrams of illustrative methods and for writing to a memory bitcell, according to various embodiments.

FIGS. 9A and 9B show flow diagrams of illustrative methods 900 and 950 for writing to a memory bitcell, according to various embodiments. Turning first to FIG. 9A, an illustrative method 900 is shown for writing a logical HIGH to a first memory bitcell of a dual bitcell configuration, such as one provided by the method 800 of FIG. 8. Embodiments of the method 900 begin at stage 904 by applying a HIGH voltage level to the write bitline, thereby causing the virtual ground line to couple with the virtual ground. At stage 908, the first write wordline can be asserted, thereby causing a first side of a set of cross-coupled inverters of the first memory bitcell to be pulled to the HIGH voltage level, and causing a second side of the set of cross-coupled inverters to be pulled to the virtual ground via the virtual ground line. At stage 912, the first write wordline can be de-asserted, so that the logical HIGH is effectively stored by the set of cross-coupled inverters.

Turning first to FIG. 9B, an illustrative method 950 is shown for writing a logical LOW to the first memory bitcell of the dual bitcell configuration, such as one provided by the method 800 of FIG. 8. Embodiments of the method 950 begin at stage 954 by applying a LOW voltage level to the write bitline, thereby causing the virtual ground line to decouple from the virtual ground. At stage 958, the first write wordline can be asserted, thereby causing a first side of a set of cross-coupled inverters of the first memory bitcell to be pulled to the LOW voltage level, and causing a second side of the set of cross-coupled inverters to be pulled to the HIGH voltage level by the set of cross-coupled inverters. At stage 962, the first write wordline can be de-asserted, so that the logical LOW is effectively stored by the set of cross-coupled inverters.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The various operations of methods and functions of certain system components described above may be performed by any suitable means capable of performing the corresponding functions. The means may include various hardware and/or software component(s) and/or module(s), including, but not limited to a circuit, an application specific integrated circuit (ASIC), or processor. For example, logical blocks, modules, and circuits described may be implemented or performed with a general purpose processor, a digital signal processor (DSP), an ASIC, a field programmable gate array signal (FPGA) or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm, or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A memory circuit comprising:
   a first memory bitcell coupled with a write bitline, a first write wordline, and a virtual ground line, so that a value stored by the first memory bitcell when the first write wordline is asserted is a function of the write bitline and the virtual ground line;
   a second memory bitcell coupled with the write bitline, a second write wordline, and the virtual ground line, so that a value stored by the second memory bitcell when the second write wordline is asserted is a function of the write bitline and the virtual ground line; and
   a virtual ground switch that operates to switch the virtual ground line as a function of the write bitline,
   wherein the virtual ground switch comprises a transistor coupled between the virtual ground line and a ground, and having a gate coupled with the write bitline.

2. The memory circuit of claim 1, wherein each memory bitcell comprises a set of cross-coupled inverters.

3. The memory circuit of claim 2, wherein each memory bitcell comprises:
   a first transistor coupled between the write bitline and the respective set of cross-coupled inverters, and having a gate coupled with the respective write wordline; and
   a second transistor coupled between the virtual ground line and the respective set of cross-coupled inverters, and having a gate coupled with the respective write wordline.

4. The memory circuit of claim 1, wherein:
   the first memory bitcell is coupled with the write bitline at a first side and with the virtual ground line at a second side, and
   when the write bitline is at a first logical level, the first side is at the first logical level, and the virtual ground switch is in a corresponding state such that the second side is at a second logical level different from the first logical level.

5. The memory circuit of claim 4, wherein when the write bitline is HIGH:
   the first side is HIGH; and
   the virtual ground switch is in a corresponding state such that the virtual ground line is pulled to a virtual ground, thereby causing the second side to be LOW.

6. The memory circuit of claim 4, wherein when the write bitline is LOW:
   the first side is LOW;
   the virtual ground switch is in a corresponding state such that the virtual ground line is not pulled to a virtual ground; and
   the first memory bitcell is configured so that the second side is HIGH when the virtual ground line is not pulled to the virtual ground.

7. The memory circuit of claim 1, wherein:
   virtual ground switch comprises means for switching the virtual ground line as a function of the write bitline; and
   each of the first and second memory bitcells comprises means for storing a value as a function of the write bitline and the virtual ground line.

8. A memory system comprising:
   a first memory bitcell coupled with a first write wordline polygate and comprising a first memory core coupled between a first write port and a second write port, the first write port coupled with a write bitline, and the second write port selectively coupled with a virtual ground; and
   a second memory bitcell coupled with a second write wordline polygate and comprising a second memory core coupled between a third write port and the second write port, the third write port coupled with the write bitline.

9. The memory system of claim 8, wherein:
   each memory bitcell operates, when its respective write wordline polygate is asserted, to store a value as a function of a present value on the write bitline and whether the second write port is presently coupled with the virtual ground.

10. The memory system of claim 8, wherein the first write port, the first memory core, the second write port, the second memory core, and the third write port form a continuous oxide diffusion column.

11. The memory system of claim 8, further comprising:
first and second read ports, each associated with a respective one of the memory bitcells and each separated from the second write port by at least one dummy transistor.

12. The memory system of claim 8, further comprising:
a first CAM port associated with the first memory bitcell; and
a second CAM port associated with the second memory bitcell,
wherein the first and second CAM ports are directly adjacent to each other and share a common voltage (VSS).

13. The memory system of claim 8, wherein the continuous oxide diffusion column has an eight-polygate pitch.

14. The memory system of claim 8, further comprising:
a plurality of dual memory bitcells, each having an instance of the first memory bitcell and an instance of the second memory bitcell.

15. The memory system of claim 8, wherein:
the memory bitcells are fabricated on a wafer having a plurality of metal layers, and
a first of the metal layers comprises a first pair of adjacent metal regions coupled with the first and second write wordline polygates, respectively.

16. The memory system of claim 15, wherein a second of the metal layers comprises:
a second pair of adjacent metal regions forming a first global match line and a first local match line, respectively, the second pair of adjacent metal regions coupled with the first memory bitcell; and
a third pair of adjacent metal regions forming a second global match line and a second local match line, respectively, the third pair of adjacent metal regions coupled with the second memory bitcell.

17. A method comprising:
coupling a first memory bitcell with a write bitline, a first write wordline, and a virtual ground line, so that a value stored by the first memory bitcell when the first write wordline is asserted is a function of the write bitline and the virtual ground line; and
coupling a second memory bitcell with the write bitline, a second write wordline, and the virtual ground line, so that a value stored by the second memory bitcell when the second write wordline is asserted is a function of the write bitline and the virtual ground line,
wherein the virtual ground line is selectively coupled with a virtual ground as a function of the write bitline using a virtual ground switch that comprises a transistor coupled between the virtual ground line and a ground and having a gate coupled with the write bitline.

18. The method of claim 17, further comprising:
configuring a virtual ground switch to switch the virtual ground line as a function of the write bitline.

19. The method of claim 17, further comprising:
writing a logical HIGH to the first memory bitcell by:
applying a HIGH voltage level to the write bitline, thereby causing the virtual ground line to couple with the virtual ground;
asserting the first write wordline, thereby causing a first side of a set of cross-coupled inverters of the first memory bitcell to be pulled to the HIGH voltage level, and causing a second side of the set of cross-coupled inverters to be pulled to the virtual ground via the virtual ground line; and
de-asserting the first write wordline, so that the logical HIGH is effectively stored by the set of cross-coupled inverters; and
writing a logical LOW to the first memory bitcell by:
applying a LOW voltage level to the write bitline, thereby causing the virtual ground line to decouple from the virtual ground;
asserting the first write wordline, thereby causing a first side of a set of cross-coupled inverters of the first memory bitcell to be pulled to the LOW voltage level, and causing a second side of the set of cross-coupled inverters to be pulled to the HIGH voltage level by the set of cross-coupled inverters; and
de-asserting the first write wordline, so that the logical LOW is effectively stored by the set of cross-coupled inverters.

* * * * *

UNITED STATES PATENT AND TRADEMARK OFFICE
CERTIFICATE OF CORRECTION

PATENT NO.        : 9,171,586 B2                                    Page 1 of 1
APPLICATION NO.   : 14/181363
DATED             : October 27, 2015
INVENTOR(S)       : Chi It is certified that error appears in the above-identified patent and that said Letters Patent is hereby corrected as shown below:

Title Page, item (57), column 2, under abstract, line 12, delete "word line" and insert -- wordline --, therefor.

In the Specification

In column 1, line 45, delete "word line" and insert -- wordline --, therefor.

In column 4, line 31, delete "colums," and insert -- columns, --, therefor.

Signed and Sealed this
Twenty-eighth Day of June, 2016

Michelle K. Lee
*Director of the United States Patent and Trademark Office*